United States Patent
Tourret

(10) Patent No.: US 10,432,191 B2
(45) Date of Patent: Oct. 1, 2019

(54) POWER MANAGEMENT SYSTEM AND METHOD THEREFOR

(71) Applicant: NXP USA, Inc., Austin, TX (US)

(72) Inventor: Jean-Robert Tourret, Cormelles-le-Royal (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/013,802

(22) Filed: Jun. 20, 2018

(65) Prior Publication Data

US 2019/0214981 A1    Jul. 11, 2019

(30) Foreign Application Priority Data

Jan. 8, 2018    (EP) .................... 18305007

(51) Int. Cl.
*H04B 3/00* (2006.01)
*H03K 17/22* (2006.01)
*G05F 1/46* (2006.01)

(52) U.S. Cl.
CPC ............. *H03K 17/223* (2013.01); *G05F 1/46* (2013.01)

(58) Field of Classification Search
None
See application file for complete search history.

(56) References Cited

U.S. PATENT DOCUMENTS

| | | |
|---|---|---|
| 7,813,098 B2 | 10/2010 | Mayell |
| 8,593,215 B2 | 11/2013 | Chen |
| 2009/0237333 A1* | 9/2009 | Saito .............. G09G 3/344 345/76 |
| 2009/0315399 A1 | 12/2009 | Shikata |
| 2014/0159496 A1* | 6/2014 | Lee .................. H02J 1/10 307/80 |
| 2017/0053764 A1 | 2/2017 | Mori et al. |

FOREIGN PATENT DOCUMENTS

EP    2650747 A1    10/2013

* cited by examiner

*Primary Examiner* — Long Nguyen

(57) ABSTRACT

A power management device includes a first switch to couple a first node corresponding to a first reference voltage to a first terminal of a first device component in response to receiving a first indicator at a first time, a compare circuit to determine at a second time that a voltage at the first terminal exceeds a first threshold value, and a second switch to couple a second node corresponding to a second reference voltage to the first terminal in response the determining.

19 Claims, 6 Drawing Sheets

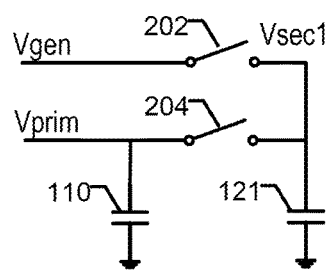
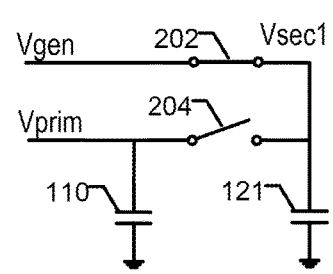
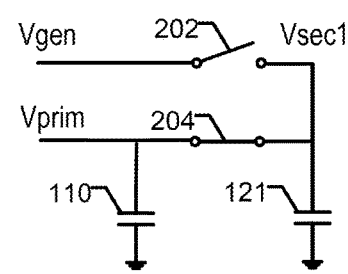
*FIG. 2a*  *FIG. 2b*  *FIG. 2c*
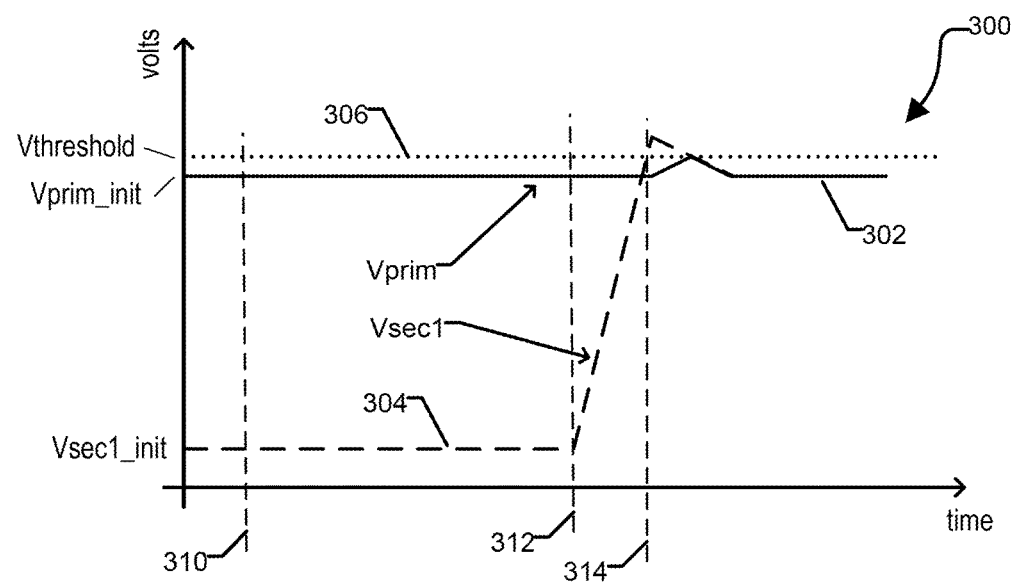
*FIG. 3*

POWER MANAGEMENT SYSTEM AND METHOD THEREFOR

CROSS-REFERENCE TO RELATED APPLICATION(S)

The present application claims priority to European Application No. EP 18305007.9, entitled "POWER MANAGEMENT SYSTEM AND METHOD THEREFOR" filed on Jan. 8, 2018, the entirety of which is herein incorporated by reference.

FIELD OF THE DISCLOSURE

This disclosure relates generally to electronics, and more particularly to integrated circuits.

BACKGROUND

Power consumption of an electronic device is an important design consideration, especially for devices that receive power from a battery. An electronic device can include multiple functional blocks. To reduce the power consumed by the device, it is advantageous to remove power from particular functional blocks that are not currently being utilized. While individual functional blocks can include dedicated voltage regulator circuitry, such an arrangement may not be cost effective. Accordingly, a single voltage regulator can be utilized to selectively provide power to two or more functional blocks.

BRIEF DESCRIPTION OF THE DRAWINGS

The present disclosure may be better understood, and its numerous features and advantages made apparent to those skilled in the art by referencing the accompanying drawings.

FIGS. 2a, 2b, and 2c are schematic diagrams illustrating operation of a power management unit according to a specific embodiment of the present disclosure.

FIG. 3 is a timing diagram illustrating operation of a switch circuit according to a specific embodiment of the present disclosure.

The use of the same reference symbols in different drawings indicates similar or identical items.

DETAILED DESCRIPTION OF THE DRAWINGS

Figure 1:
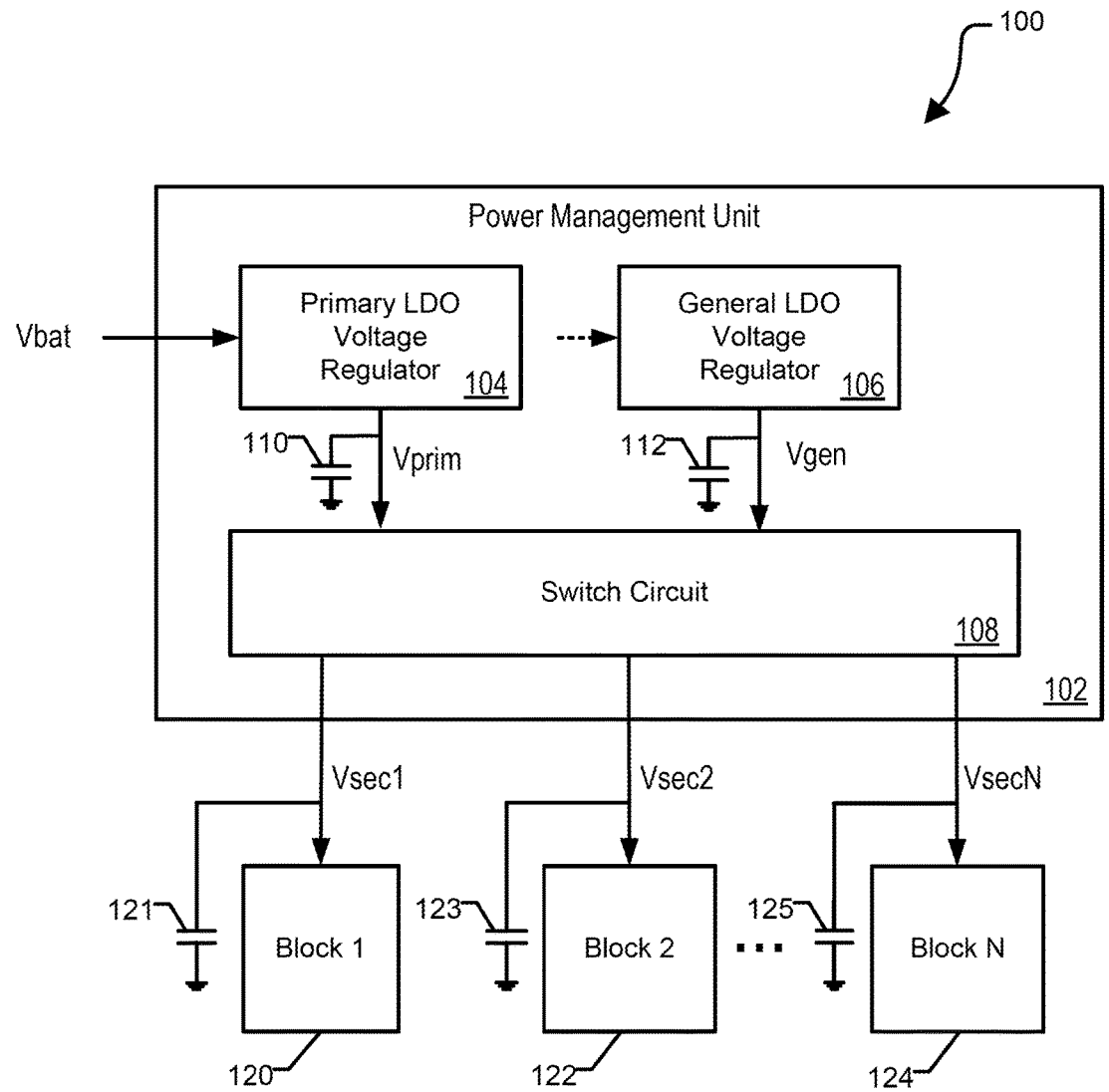
FIG. 1 is a schematic diagram illustrating is a block diagram of an electronic device according to a specific embodiment of the present disclosure.

An electronic device often includes individual circuits that are dedicated to performing a specific function. One technique for reducing power consumption at an electronic device is to deactivate portions of the device that are not needed at a particular time, and reenergizing individual functional blocks when their operation is once again required. For example, a device can include one or more functional blocks that remain energized while the device is operational. A so-called always-on block can deactivate and reactivate other functional blocks as needed. For example, an always-on block at a security alarm system can monitor a sensor for activity, and energize a communication network interface or other subsystems when the activity is detected.

When a previously deactivated functional block is reenergized, additional power demand associated with the block can momentarily disturb a supply voltage provided by a power distribution system. For example, the voltage provided by a shared power regulator to multiple activated functional blocks can temporarily dip due to charge-sharing that can occur when an output of the shared power regulator is suddenly required to charge another functional block that is being reenergized from a deactivated state. When power is supplied to a functional block, some amount of capacitance (e.g., due to parasitic capacitances, other known capacitances, or both) may be implemented by the circuitry of the functional block, also referred to as effective capacitance of the functional block. This effective capacitance may vary for each functional block, since each functional block may implement some different function of the IC using different circuitry. Depending on the various modes of operation of the device, any combination of the functional blocks may be in an activated or deactivated state at various times. If a functional block is reenergized or multiple functional blocks are reenergized concurrently, and the reenergized blocks are coupled to the primary power domain that includes activated and operating functional blocks, the power provided across the primary power domain may dip due to charge-sharing across the primary power domain. If the voltage dip is significant, the activated and operating functional blocks receiving power from the regulator may experience a fault. For example, state information stored at a latch device can be lost, clocks signals can transition improperly, and the like. This problem is exacerbated if the voltage regulator is weakly biased or slow to respond to a change in load. One approach may implement a decoupling capacitance at the output of the power regulator that is much larger than the effective capacitance of the functional block(s) being reenergized. However, since any number of functional blocks may be reenergized concurrently by the shared power regulator, the overall effective capacitance of the functional blocks being reenergized may be difficult to determine at any given time.

The present disclosure provides a two-step approach to reenergizing functional blocks that minimizes voltage disturb to a primary power domain without requiring the effective capacitance of the functional blocks being reenergized to be known. A secondary power domain is provided to reenergize one or more functional blocks from a deactivated state to an activated state. A switch circuit is provided to switch the reenergized functional blocks to a primary power domain for continued operation once an input voltage level of the functional blocks reaches a predetermined voltage level. The predetermined voltage level is a minimum precharge voltage level necessary to insure that the voltage level of the primary power domain does not dip enough to adversely effect operation of functional blocks receiving power from the primary power domain when the primary power domain is connected to the reenergized functional block. FIGS. 1-7 illustrate techniques for managing power distribution at an electronic device that mitigate disturbance of the power supply voltage.

FIG. 1 is a block diagram of an electronic device 100 according to a specific embodiment of the present disclosure. Electronic device can include one or more integrated circuits. Electronic device 100 includes a power management unit (PMU) 102 that is configured to selectively provide power to functional blocks 120, 122, and 124. PMU 102 includes a primary low-dropout voltage regulator (LDO) 104, a general LDO 106, and a switch circuit 108. Primary LDO 104 includes an input to receive battery voltage, Vbat, and an output terminal to provide a primary reference voltage, Vprim, to switch circuit 108. The techniques disclosed herein are particularly applicable to low-power devices that receive operating power from a battery. For example, a class of electronic devices known as Internet of Things (IoT) may receive power from an included battery, such as a coin-style battery, and yet are expected to operate for an extended period before the battery becomes depleted. Accordingly, it is desirable to reduce the power consumption of the primary LDO while facilitating the deenergizing and reenergizing of functional blocks.

A decoupling capacitor 110 is provided at the Vprim output terminal to shunt electrical noise and, in an embodiment, provide additional energy storage to improve regulation of reference voltage Vprim. General LDO 106 includes an output terminal to provide a general reference voltage, Vgen, to switch circuit 108. A decoupling capacitor 112 is provided at the Vgen output terminal. Switch circuit 108 includes a first output to provide a reference voltage, Vsec1, to a power supply input of functional block 120; a second output to provide a reference voltage, Vsec2, to a power supply input of functional block 122; and a third output to provide a reference voltage, VsecN, to a power supply input of functional block 124. Each of functional blocks 120, 122, and 124 include a respective decoupling capacitor, 121, 123, and 125 connected to a corresponding power supply input. Switch circuit 108 can include additional inputs and output, not shown at FIG. 1 for clarity.

During operation, PMU 102 is configured to energize one or more of functional blocks 120, 122, and 124 based on particular activities underway at electronic device 100. In particular, PMU 102 is configured to control operation of switch circuit 108, and the generation of reference voltages Vsec1, Vsec2, and VsecN that supply power to functional blocks 120, 122, and 124. For example, PMU 102 can configure switch circuit 108 to transition functional block 120 from a powered-down state to an energized state by transitioning reference voltage Vsec1 from a ground potential to an operational potential. Similarly, PMU 102 can configure switch circuit 108 to transition functional block 120 from an energized state to a powered-down state by transitioning reference voltage Vsec1 from the operational potential to a ground potential. Electronic device 100 can include an always-on block (not shown at FIG. 1) that is responsible for determining when the services provided by a particular functional block are required. Such an always-on block may implement logic (e.g., according to a particular protocol implemented by the device) that provides an enable signal or other indicator signal to switch circuit 108 to indicate activation of a particular functional block, as further described below.

Reference voltage Vprim is a primary supply reference voltage utilized by functional blocks 120, 122, and 124 when operational. Accordingly, switch circuit 108 is configured to transition functional blocks 120, 122, and 124 to and from an energized state in such a manner that reference voltage Vprim is not disturbed. For example, if functional block 120 is presently energized (Vsec1 is at an operational potential) and functional block 122 needs to be reenergized, switch circuit 108 is configured to enable reference voltage Vsec2 without substantially disturbing reference voltage Vprim and voltage reference Vsec1. In an embodiment, reference voltage Vgen is only utilized to pre-charge a capacitance at the power supply input of a function block that is transitioning from a deactivated state to an energized state. While FIG. 1 illustrates the generation of reference voltage Vgen using general LDO 106, reference voltage Vgen can be provided by another type of voltage regulator or power source, which may be internal or external to electronic device 100.

FIGS. 2a, 2b, and 2c are schematic diagrams 200 illustrating operation of PMU 102 of FIG. 1 according to a specific embodiment of the present disclosure. In particular, FIGS. 2a, 2b, and 2c illustrate a sequence of events performed by switch circuit 108 when PMU 102 reenergizes functional block 120 of FIG. 1. Schematic diagrams 200 provide a simplified view of the operation of switch circuit 108. FIGS. 2a, 2b, and 2c each include a switch 202 that selectively couples reference voltage Vgen to the power supply input of block 120, and a switch 204 that selectively couples reference voltage Vprim to the power supply input of block 120. Also illustrated is decoupling capacitor 110 provided at the Vprim output terminal of LDO 104, and decoupling capacitor 121 provided at the power supply input of functional block 120.

FIG. 2a illustrates configuration of switch circuit 108 when functional block 120 is deactivated. In particular, switches 202 and 204 are both open so that neither of reference voltage Vgen or reference voltage Vprim is electrically connected to block 120. At FIG. 2b, switch 202 is closed in response to receiving indication that block 120 is to be reenergized. Closing switch 202 couples reference voltage Vgen to the power supply input of block 120. When switch 202 is closed, reference voltage Vsec1 increases from a ground potential to a potential corresponding to Vgen as decoupling capacitor 121 and other capacitance associated with the power supply input of block 120 are charged. The rate at which reference voltage Vsec1 approached reference voltage Vgen is determined based on the current transfer characteristics of switch 202 and based on the capacitive and resistive load represented by functional block 120. The total capacitance associated with power supply input of block 120 can further include NWELL to substrate parasitic capacitances, gate capacitances, and the like associated with circuitry at block 120. It is difficult to estimation the total capacitance at the power supply input of block 120 during the design process because some of the capacitances are voltage dependent and non-linear with respect to voltage level. Accordingly, switch circuit includes a comparator that is configured to dynamically adjust how long switch 202 remains closed so that reference voltage Vsec1 is pre-charged to a desired voltage level.

At FIG. 2c, switch 202 is opened and switch 204 is closed in response to determining that a voltage level of reference voltage Vsec1 has reached a predetermined threshold value. In an embodiment, the threshold value is substantially the same as the level of reference voltage Vprim. Closing switch 204 couples reference voltage Vprim to the power supply input of block 120. By pre-charging decoupling capacitor 121 and other capacitances associated with the power supply input of block 120, minimal charge sharing occurs between the primary decoupling capacitor 110 and the secondary decoupling capacitor 121. Accordingly, a voltage level at Vprim is not substantially disturbed when switch 204 is closed. The operation of switch circuit 108 can be better understood with reference to FIG. 3.

Switch 202 can be implemented using a current source or a low impedance transistor switch circuit, for example using one or more field effect transistors (FET) or bipolar P-type transistors. In an embodiment, switch 202 can be implemented using a voltage follower or operational amplifier, which can include one or more FET or bipolar N-type transistors. For example, a unity gain operational amplifier can include a power stage implemented using a native NMOS transistor having a low threshold voltage. As used herein, the term native is used to represent a FET that is fabricated using minimal or no threshold voltage adjustment. Switch 204 can be implemented using a PMOS transistor, an array of PMOS transistors in a parallel configuration, or the like. In an embodiment, each transistor of a parallel configuration of transistors can include a corresponding gate buffer.

FIG. 3 is a timing diagram 300 illustrating operation of switch circuit 108 of FIG. 1 according to a specific embodiment of the present disclosure. Timing diagram 300 includes a horizontal axis representing time, a vertical axis representing voltage, a waveform 302 corresponding to reference voltage Vprim, a waveform 304 corresponding to reference voltage Vsec1, a threshold level 306 labeled Vthreshold, and time references 310, 312, and 314. At time 310, both of switches 202 and 204 are in an open configuration and reference voltage Vsec1 is at a voltage level Vsec1_init, such as a ground potential. Configuration of switches 202 and 204 at time reference 310 corresponds to FIG. 2a. At this time and prior to time 312, reference voltage Vprim is at a voltage level Vprim_init, and LDO 104 may be providing power to portions of electronic device 100, such as functional blocks 122 and 124.

At time 312, switch 202 is closed in response to receiving an indication that functional block 120 is to be energized. Closing switch 202 couples reference voltage Vgen to the power supply input of block 120. Reference voltage Vsec1 begins to increase from the initial level, Vsec1_init, as reference voltage Vgen charges decoupling capacitor 121 and other capacitance at the power supply input of functional block 120. Configuration of switches 202 and 204 at time 312 corresponds to FIG. 2b. Switch 204 remains open until the level of reference voltage Vsec1 reaches the level of threshold voltage 306, Vthreshold. While the value of threshold voltage 306 is shown at FIG. 3 to be greater than that of reference voltage Vprim, another value of threshold voltage 306 may be selected. For example, the value of threshold voltage 306 may be less than that of reference voltage Vprim, or may be substantially equal to that of reference voltage Vprim. As another example, the value of threshold voltage 306 may be a value that falls within a range of ±500 mV from Vprim, or may be a value that falls within a range of ±10 mV from Vprim, or may be a value that falls within a range of ±100 mV from Vprim, where such embodiments may depend on the accuracy of the comparator implemented in the switch circuit 108. At time 314, the voltage level of reference voltage Vsec1 has reached the value of threshold voltage 306, and in response, switch 202 is opened and switch 204 is closed. Configuration of switches 202 and 204 at time 314, and thereafter, corresponds to FIG. 2c. At this time, functional block 120 is now receiving power the primary LDO 104.

Timing diagram 300 illustrates a small disturbance of voltage reference Vprim when switch 202 is opened and switch 204 is closed. This small disturbance can be caused by charge sharing from decoupling capacitor 121 back to decoupling capacitor 110, miller effect associated with the switching of switches 202 and 204, and the like. The disturbance can be negligible or substantially nonexistent, and is too small to negatively impact operation of other circuitry that is receiving power from primary LDO 104 when functional block 120 is energized.

Figure 4:
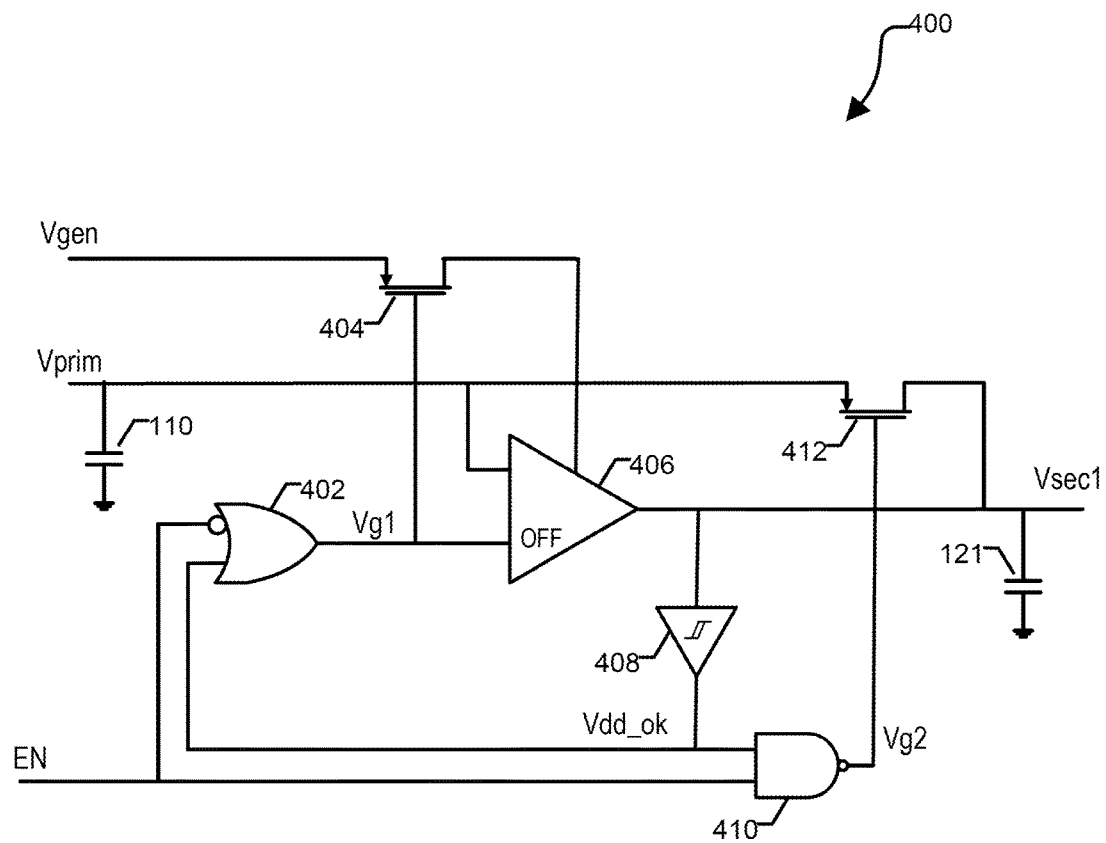
FIG. 4 is a schematic diagram illustrating a switch circuit according to a specific embodiment of the present disclosure.

FIG. 4 is a schematic diagram illustrating a switch circuit 400 according to a specific embodiment of the present disclosure. In particular, switch circuit 108 can include plural instantiations of switch circuit 400, for example, one instantiation for each functional block at electronic device 100 that can be deactivated and reenergized. Switch circuit 400 includes a PMOS transistor 404 corresponding to switch 202 of FIG. 2, and a PMOS transistor 412 corresponding to switch 204 of FIG. 2. Switch circuit 400 further includes a logic gate 402, a voltage follower 406, a voltage comparator 408, a logic gate 410, decoupling capacitors 110 and 121, an input to receive reference voltage Vgen, an input to receive reference voltage Vgen, an input to receive an enable signal EN, and an output to provide reference voltage Vsec1.

The operation of switch circuit 400 can be best understood in the context of transitioning functional block 120 from a deactivated state to an energized state, as illustrated in FIGS. 2a, 2b, 2c, and in FIG. 3. For example, at time 310, reference voltage Vprim is active and potentially supplying power to portions of electronic device 100. At time 310, reference voltage Vgen is also active and ready to pre-charge capacitance at the the power supply input of a functional block that is transitioning to an energized state. Signal EN is at a logic-low level corresponding to the deactivated state of functional block 120. Accordingly, signal Vg1 provided by logic gate 402 is at a logic-high state, causing PMOS transistor 404 to be deactivated, and signal Vg2 provided by logic gate 410 is also at a logic-high state, causing PMOS transistor 412 to be deactivated. Signal Vdd_ok is also at a logic-low state. Consequently, reference voltage Vsec1 is deactivated, for example at a ground potential.

At a time corresponding to time 312 of FIG. 3, signal EN is asserted to indicate that functional block 120 is to be energized. A logic-high state of signal EN causes signal Vg1 to transition to a logic-low state, which activates PMOS transistor 404 and couples reference voltage Vgen to voltage follower 406. Reference voltage Vgen begins to charge decoupling capacitor 121 by way of PMOS transistor 404 and voltage follower 406. Voltage follower 406 is configured to charge capacitance associated with node Vsec1 using current provided by reference voltage Vgen. Voltage follower 406 includes an input to receive reference voltage Vprim, which controls the voltage level provided at the output of voltage follower 406. Initially, signal Vdd_ok is at a logic-low state. Accordingly, signal Vg2 is at a logic-high state, which maintains PMOS transistor 412 in a deactivated condition. At time 314, the level of reference voltage Vsec1 reaches a threshold defined at comparator 408, signal Vdd_ok transitions to a logic-high state causing PMOS transistor 404 and voltage follower 406 to be deactivated, isolating reference voltage Vgen from functional block 120. In an embodiment, voltage follower 406 can prevent reference voltage Vsec1 from exceeding a predetermined level during the pre-charging phase. A logic-high state of signal Vdd_ok further causes signal Vg2 to transition to a logic-low state, which activates PMOS transistor 412. Activation of PMOS transistor 412 couples the primary reference voltage Vprim to functional block 120. Functional block 120 is now fully energized and operational.

In an embodiment, the threshold voltage level at comparator 408 can be greater than the level of reference voltage Vprim. Accordingly, voltage follower 406 can provide voltage gain so a level of reference voltage Vsec1 can rise above a level of reference voltage Vprim. In an embodiment, comparator 408 can provide adequate hysteresis to insure that assertion of signal Vdd_ok is monotonic and stable. In an embodiment, the logic functions performed by logic gates 402 and 410 can be provided by a controller or sequencer included at PMU 102 (not shown at FIG. 1).

Figure 5:
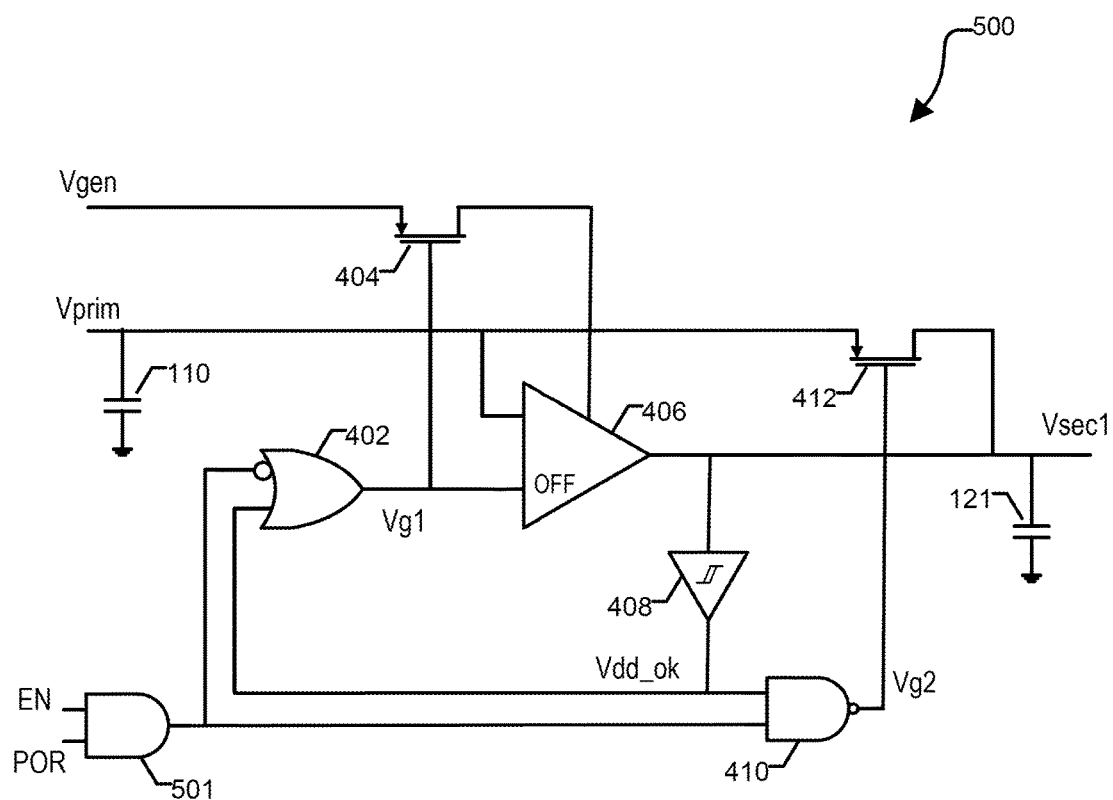
FIG. 5 is a schematic diagram illustrating a switch circuit according to another embodiment of the present disclosure.

FIG. 5 is a schematic diagram illustrating a switch circuit 500 according to another embodiment of the present disclosure. Switch circuit 500 is identical to switch circuit 400 of FIG. 4 with one exception. In order to prevent meta-stability at functional block 120 when power is first provided to electronic device 100, enable signal EN is further qualified by a power-on-reset signal, POR. Upon initialization of device 100, signal POR remains at a logic-low state until voltage reference Vprim has stabilized and logic circuits have reset to an initial state. Prior to the assertion of signal POR, the integrity of signal EN is not assured, which can inadvertently cause switching of transistors 404 and 412.

Figure 6:
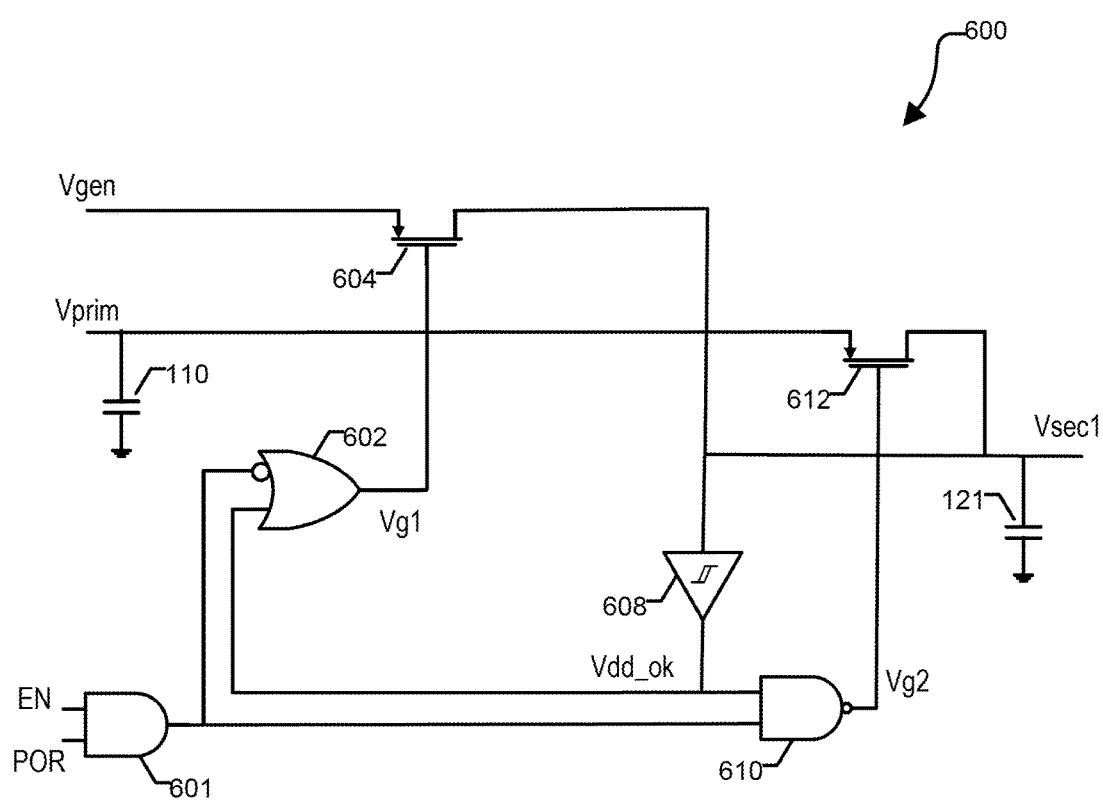
FIG. 6 is a schematic diagram illustrating a switch circuit according to still another embodiment of the present disclosure.

FIG. 6 is a schematic diagram illustrating a switch circuit 600 according to still another embodiment of the present disclosure. Switch circuit 600 is similar to switch circuit 500 except voltage follower 408 has been omitted. Instead, a PMOS transistor 604 directly couples reference voltage Vgen to the power supply input of functional block 120 (Vsec1). Operation of switch circuit 600 is fundamentally the same as described above with reference to switch circuit 400. In particular, assertion of signal EN and signal POR causes signal Vg1 to transition to a logic-low state, activating PMOS transistor 604 and causing reference voltage Vsec1 to begin increasing. Signal Vdd_ok is asserted by a comparator 608 when reference voltage Vsec1 reaches a predetermined threshold. Assertion of signal Vdd_ok causes logic gate 602 to deactivate PMOS transistor 604 and causes logic gate 610 to activate a PMOS transistor 612, coupling reference voltage Vprim to the power supply input of functional block 120 (Vsec1). Without the over-voltage protection that voltage follower 406 can provide, comparator 608 should toggle quickly enough to prevent reference voltage Vsec1 from rising to an excessive level that can cause damage to circuitry receiving power from terminal Vsec1.

Figure 7:
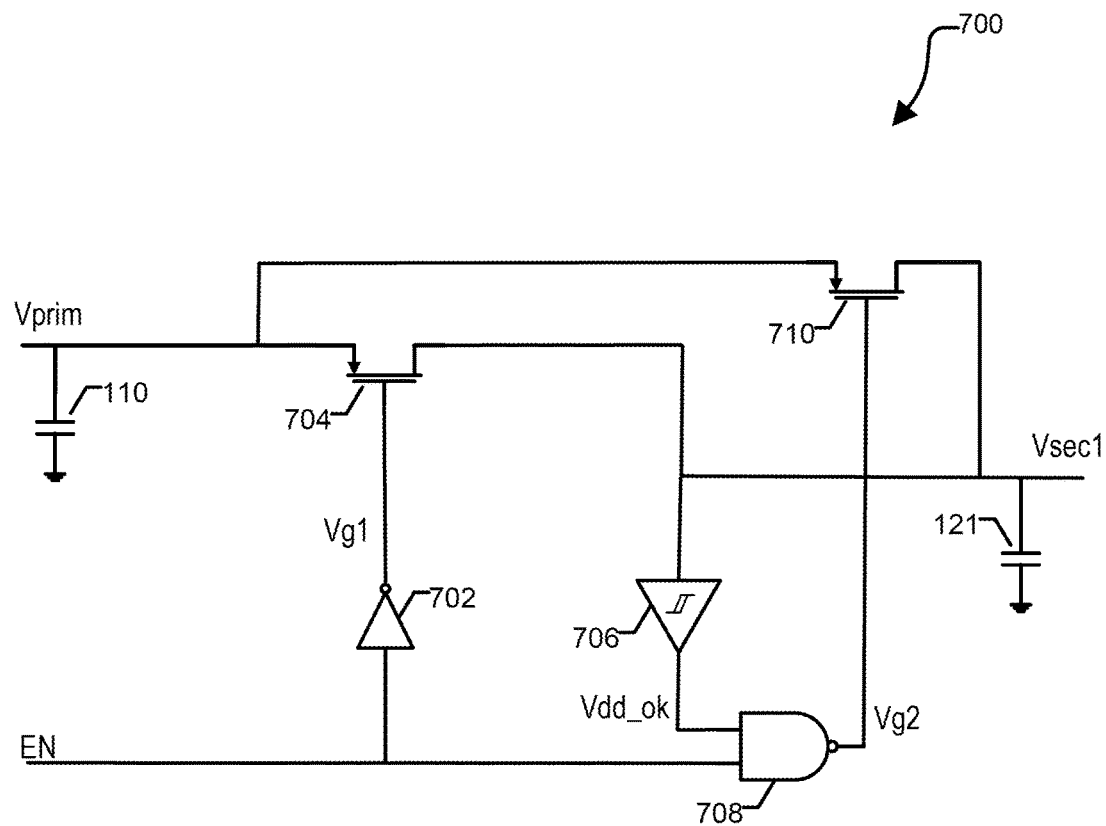
FIG. 7 is a schematic diagram illustrating a switch circuit according to yet another embodiment of the present disclosure.

FIG. 7 is a schematic diagram illustrating a switch circuit 700 according to yet another embodiment of the present disclosure. Switch circuit 700 includes PMOS transistor 704 and PMOS transistor 710 that are each configured to selectively couple reference voltage Vprim to the power supply input of functional block 120 (Vsec1). Switch circuit 700 further includes an inverter 702, a comparator 706, a logic gate 708, and decoupling capacitors 110 and 121. Assertion of signal EN activates transistor 704, coupling reference voltage Vprim to the output node corresponding to reference voltage Vsec1. A level of reference voltage Vsec1 begins to increase as decoupling capacitor 121 is charged. When a level of reference voltage Vsec1 has increased to a predetermined threshold voltage, comparator 706 asserts signal Vdd_ok, causing signal Vg2 to switch to a logic-low value, and thereby activating transistor 710. The size of transistor 704 is selected so that an inrush of current through transistor 704, while charging decoupling capacitor 121, does not cause reference voltage Vprim to dip excessively.

In a first aspect, a power management device includes a first switch to couple a first node corresponding to a first reference voltage to a first terminal of a first device component in response to receiving a first indicator at a first time; a compare circuit to determine at a second time that a voltage at the first terminal exceeds a first threshold value, the second time after the first time; and a second switch to couple a second node corresponding to a second reference voltage to the first terminal in response the determining. In an embodiment of the first aspect, the power management device further includes a third switch to couple the second node to a terminal of a second device component prior to the first time. In another embodiment of the first aspect, the second reference voltage is a primary supply voltage associated with normal operation of the first component and a second component, and the first reference voltage is utilized during transition of a device component from an unpowered state to a powered state. In yet another embodiment of the first aspect, the power management device further includes a first decoupling capacitor connected to the second node; and a second decoupling capacitor coupled to the first terminal; wherein the second decoupling capacitor is precharged by the first reference voltage via the first switch prior to activating the second switch.

In still another embodiment of the first aspect, the power management device, further includes a first decoupling capacitor connected to the second node; and a second decoupling capacitor coupled to the first terminal; wherein a voltage deviation at the second node in response to activation of the second switch does not impair operation of a second component that is receiving power from the second node. In another embodiment of the first aspect, the power management device further includes a low-dropout voltage regulator to supply the second reference voltage at the second node. In yet another embodiment of the first aspect, the first switch includes a current source to couple the first reference voltage to the first terminal, the current source comprising a P-type transistor. In still another embodiment of the first aspect, the first switch includes a low threshold voltage N-type transistor. In another embodiment of the first aspect, an input of the compare circuit is coupled to the first node via the first switch and via a voltage follower. In another embodiment of the first aspect, the first switch includes a P-type transistor having a first current electrode coupled to the first node and a second current electrode coupled to the first terminal. In still another embodiment of the first aspect, the first indicator is qualified based on assertion of a signal indicating a power-on-reset sequence has completed. In yet another embodiment of the first aspect, the first threshold value is substantially equal to the second reference voltage.

In a second aspect, a method includes receiving a request to activate a first functional block at a first time, the first functional block not receiving power prior to the first time; coupling a first node corresponding to a first reference voltage to a terminal of the first functional block in response to receiving the request; determining at a second time that a voltage level at the terminal exceeds a first threshold value, the second time after the first time; and coupling a second node corresponding to a second reference voltage to the first terminal in response the determining. In an embodiment of the second aspect, the method further includes coupling the second node to a terminal at a second functional block prior to the first time. In another embodiment of the second aspect, the second reference voltage is a primary supply voltage associated with normal operation of the first component and a second component, and the first reference voltage is utilized during transition of a device component from an unpowered state to a powered state. In still another embodiment of the second aspect, a voltage deviation at the second node in response to the coupling of the second node to the first terminal does not impair operation of a second functional block that is receiving power from the second node. In yet another embodiment of the second aspect, the method further includes generating the second reference voltage using a low-dropout voltage regulator.

In a third aspect, a system includes a first functional block including a first terminal to receive operating power; a second functional block including a second terminal to receive operating power; a first voltage regulator to provide a first reference voltage at a first node; a second voltage regulator to provide a second reference voltage at a second node; and a power management circuit. The power management circuit includes a first switch to couple the first node to the first terminal; a second switch to couple the second node to the second terminal in response to receiving a first indicator at a first time; a compare circuit to determine at a second time that a voltage at the second terminal exceeds a first threshold value, the second time after the first time; and a third switch to couple the first node to the second terminal in response the determining. In an embodiment of the third aspect, the first reference voltage is a primary supply voltage associated with normal operation of the first component and the second component, and the second reference voltage is utilized during transition of a device component from an unpowered state to a powered state. In another embodiment of the third aspect, the system includes a first decoupling capacitor connected to the first node; and a second decoupling capacitor coupled to the first terminal; wherein the second decoupling capacitor is pre-charged by the second reference voltage via the second switch prior to activating the third switch.

As used herein, the terms "substantial" and "substantially" mean sufficient to achieve the stated purpose or value in a practical manner, taking into account any minor imperfections or deviations, if any, that arise from usual and expected abnormalities that may occur during device operation, which are not significant for the stated purpose or value.

The preceding description in combination with the Figures was provided to assist in understanding the teachings disclosed herein. The discussion focused on specific implementations and embodiments of the teachings. This focus was provided to assist in describing the teachings, and should not be interpreted as a limitation on the scope or applicability of the teachings. However, other teachings can certainly be used in this application. The teachings can also be used in other applications, and with several different types of architectures.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A power management device comprising:
    a first switch to couple a first node corresponding to a first reference voltage to a first terminal of a first device component in response to receiving a first indicator at a first time;
    a compare circuit to determine at a second time that a voltage at the first terminal exceeds a first threshold value, the second time after the first time; and
    a second switch to couple a second node corresponding to a second reference voltage to the first terminal in response the determining.

2. The power management device of claim 1, wherein the second reference voltage is a primary supply voltage associated with normal operation of the first component and a second component, and the first reference voltage is utilized during transition of a device component from an unpowered state to a powered state.

3. The power management device of claim 1, further comprising:
    a first decoupling capacitor connected to the second node; and
    a second decoupling capacitor coupled to the first terminal;
    wherein the second decoupling capacitor is pre-charged by the first reference voltage via the first switch prior to activating the second switch.

4. The power management device of claim 1, further comprising:
    a first decoupling capacitor connected to the second node; and
    a second decoupling capacitor coupled to the first terminal;
    wherein a voltage deviation at the second node in response to activation of the second switch does not impair operation of a second component that is receiving power from the second node.

5. The power management device of claim 1, further comprising:
    a low-dropout voltage regulator to supply the second reference voltage at the second node.

6. The power management device of claim 1, wherein the first switch comprises a current source to couple the first reference voltage to the first terminal, the current source comprising a P-type transistor.

7. The power management device of claim 1, wherein the first switch comprises a low threshold voltage N-type transistor.

8. The power management device of claim 1, wherein an input of the compare circuit is coupled to the first node via the first switch and via a voltage follower.

9. The power management device of claim 1, wherein the first switch comprises a P-type transistor having a first current electrode coupled to the first node and a second current electrode coupled to the first terminal.

10. The power management device of claim 1, wherein the first indicator is qualified based on assertion of a signal indicating a power-on-reset sequence has completed.

11. The power management device of claim 1, wherein the first threshold value is substantially equal to the second reference voltage.

12. A method comprising:
   receiving a request to activate a first functional block at a first time, the first functional block not receiving power prior to the first time;
   coupling a first node corresponding to a first reference voltage to a terminal of the first functional block in response to receiving the request;
   determining at a second time that a voltage level at the terminal exceeds a first threshold value, the second time after the first time; and
   coupling a second node corresponding to a second reference voltage to the first terminal in response the determining.

13. The method of claim 12, further comprising:
   coupling the second node to a terminal at a second functional block prior to the first time.

14. The method of claim 12, wherein the second reference voltage is a primary supply voltage associated with normal operation of the first component and a second component, and the first reference voltage is utilized during transition of a device component from an unpowered state to a powered state.

15. The method of claim 12, wherein a voltage deviation at the second node in response to the coupling of the second node to the first terminal does not impair operation of a second functional block that is receiving power from the second node.

16. The method of claim 12, further comprising:
   generating the second reference voltage using a low-dropout voltage regulator.

17. A system comprising:
   a first functional block including a first terminal to receive operating power;
   a second functional block including a second terminal to receive operating power;
   a first voltage regulator to provide a first reference voltage at a first node;
   a second voltage regulator to provide a second reference voltage at a second node; and
   a power management circuit comprising:
      a first switch to couple the first node to the first terminal;
      a second switch to couple the second node to the second terminal in response to receiving a first indicator at a first time;
      a compare circuit to determine at a second time that a voltage at the second terminal exceeds a first threshold value, the second time after the first time; and
      a third switch to couple the first node to the second terminal in response the determining.

18. The system of claim 17 wherein the first reference voltage is a primary supply voltage associated with normal operation of the first component and the second component, and the second reference voltage is utilized during transition of a device component from an unpowered state to a powered state.

19. The system of claim 17, further comprising:
   a first decoupling capacitor connected to the first node; and
   a second decoupling capacitor coupled to the first terminal;
   wherein the second decoupling capacitor is pre-charged by the second reference voltage via the second switch prior to activating the third switch.

* * * * *